(12) United States Patent
Ruehrig et al.

(10) Patent No.: US 7,280,393 B2
(45) Date of Patent: Oct. 9, 2007

(54) MRAM MEMORY CELL HAVING A WEAK INTRINSIC ANISOTROPIC STORAGE LAYER AND METHOD OF PRODUCING THE SAME

(75) Inventors: Manfred Ruehrig, Eckental (DE); Joachim Wecker, Roettenbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/634,988

(22) Filed: Dec. 7, 2006

(65) Prior Publication Data
US 2007/0086236 A1 Apr. 19, 2007

Related U.S. Application Data

(63) Continuation of application No. 11/051,471, filed on Feb. 7, 2005, now abandoned.

(30) Foreign Application Priority Data

Feb. 6, 2004 (DE) ............... 10 2004 005 921
Jan. 28, 2005 (DE) ............... 10 2005 004 126

(51) Int. Cl.
*G11C 11/34* (2006.01)
(52) U.S. Cl. .................. 365/171; 365/158
(58) Field of Classification Search ........... 365/158, 365/171, 173
See application file for complete search history.

(56) References Cited

U.S. PATENT DOCUMENTS

| | | | | |
|---|---|---|---|---|
| 5,953,248 A | * | 9/1999 | Chen et al. | 365/158 |
| 5,966,323 A | * | 10/1999 | Chen et al. | 365/158 |
| 5,982,660 A | * | 11/1999 | Bhattacharyya et al. | 365/173 |
| 6,531,723 B1 | * | 3/2003 | Engel et al. | 257/200 |
| 6,554,278 B1 | * | 4/2003 | Haddox | 273/119 R |
| 6,936,903 B2 | * | 8/2005 | Anthony et al. | 257/422 |
| 2003/0063492 A1 | * | 4/2003 | Ruhrig et al. | 365/171 |

OTHER PUBLICATIONS

RP Cowburn, "Property variation with shape in magnetic nanoelements" J. Phys. D: Applied Phys. 33 (2000), pp. R1-R16.*
Daniel Braun, "Effect of crystalline disorder on magnetic switching in small magnetic cells," Journal of Magnetism and Magnetic Materials 261 (2003), p. 295-303.*

(Continued)

*Primary Examiner*—Richard T. Elms
*Assistant Examiner*—Alexander Sofocleous
(74) *Attorney, Agent, or Firm*—Edell, Shapiro & Finnan, LLC

(57) ABSTRACT

An MRAM memory cell has a layer system of circular-disk-shaped layers. The memory cell includes two magnetic layers separated by a nonmagnetic intermediate layer. The first magnetic layer or reference layer exhibits hard-magnetic behavior. The second magnetic layer or storage layer exhibits soft-magnetic behavior. Information is stored by the magnetization state of the storage layer. The storage layer has a weak intrinsic anisotropy that defines a magnetic preferred direction. The magnetization direction of the reference layer is parallel to the magnetization direction of a remnant magnetization in the interior of the storage layer. The remnant magnetization occurs as a result of applying an external magnetic field with a field component perpendicular to the preferred direction of the intrinsic anisotropy of the storage layer.

5 Claims, 3 Drawing Sheets

OTHER PUBLICATIONS

L.D. Buda, et al., "Micromagnetic simulation of magnetizations in circuilar cobalt dots," Computational Materials Science 24 (2002), pp. 181-185.*

M. Demand, et al., "Magnetic domain structures in arrays of submicron Co dots studied with magnetic force microscopy," Journal of Applied Physics, vol. 87, No. 9, May 1, 2000, pp. 5111-5113*

J. Fidler, et al., "Micromagnetic simulation of the magnetic switching behavious of mesoscopic and nanoscopic structures," Computational Materials Science 24 (2002), pp. 163-174.*

K. Yu. Guslienko, et al., "Magnetization reversal due to vortex nucleation, displacement, and annihilation in submicron ferromagnetic dot arrays," Physical Review B., vol. 65, pp. 024414-1-024414-10.*

Jing Shi et al., "Geometry dependence of magnetization vortices in patterned submicron NiFe elements," Applied Physics Letters, vol. 76, No. 18, May 1, 2000, pp. 2588-2590.*

Jonathan Kin Ha, et al., "Micromagnetic study of magnetic configurations in submicron permalloy disks," Physical Review B, 67, (2003), pp. 244432-1-24432-9.*

Horst Hoffman, "Influence of local inhomogeneities on the magnetic properties of thin ferromagnetic films and nanostructures," Thin Solid Films 3763 (2000), pp. 107-112.*

* cited by examiner

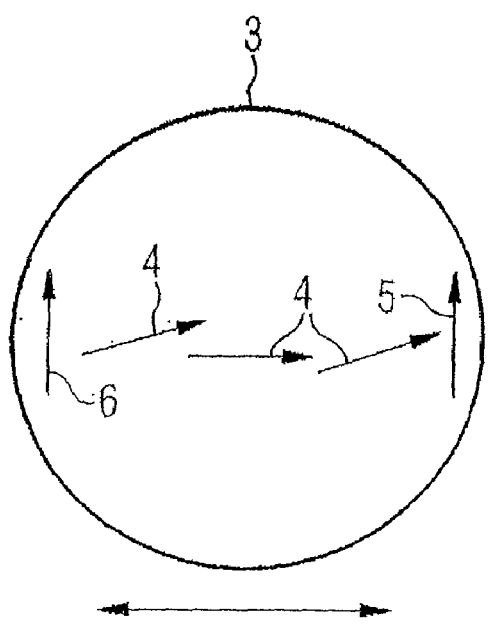
FIG.1A
PRIOR ART
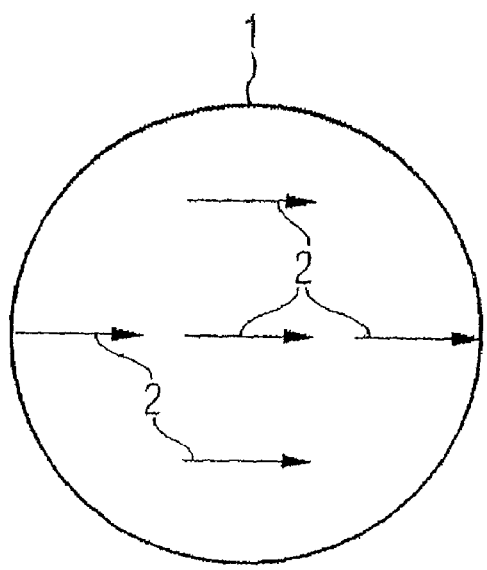
FIG.1C
PRIOR ART
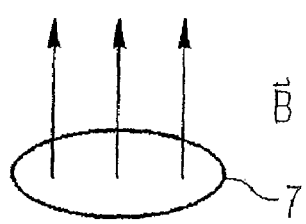
FIG.1B
PRIOR ART
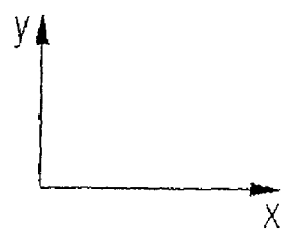

FIG.3A
FIG.3B
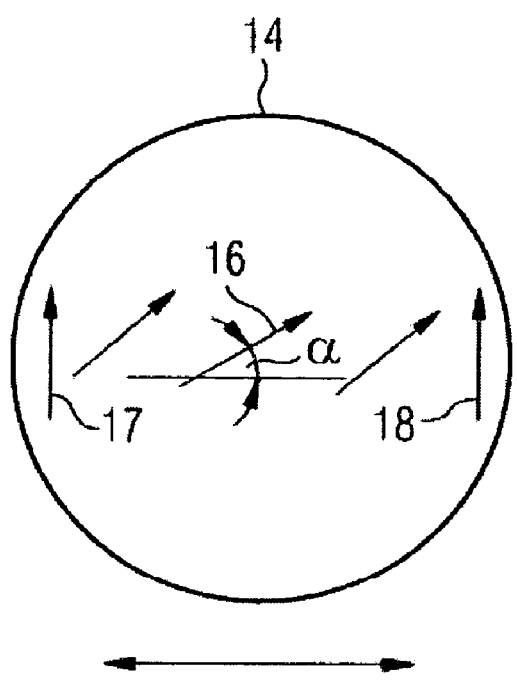
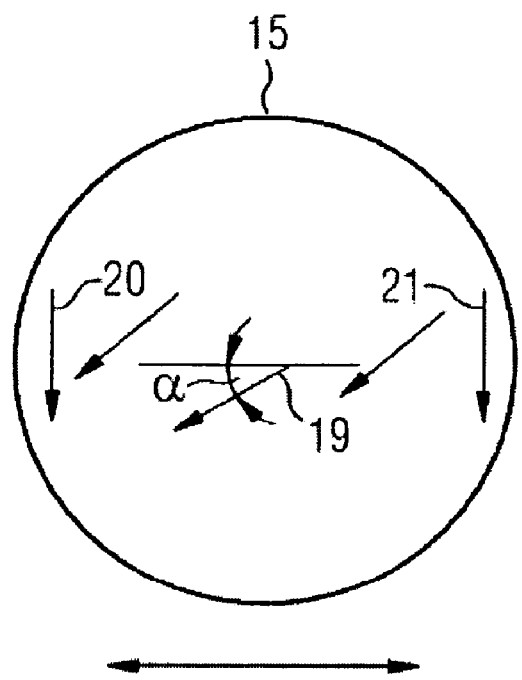
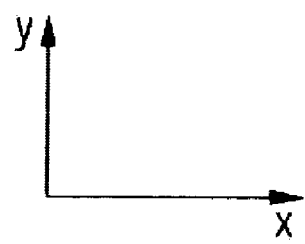

MRAM MEMORY CELL HAVING A WEAK INTRINSIC ANISOTROPIC STORAGE LAYER AND METHOD OF PRODUCING THE SAME

CROSS REFERENCE TO RELATED APPLICATIONS

This application is a continuation of U.S. patent application Ser. No. 11/051,471 filed Feb. 7, 2005 now abandoned, which in turn claims priority under 35 USC § 119 to German Application No. DE 10 2004 005 921.7, filed on Feb. 6, 2004, and to German Application No. DE 10 2005 004 126.4, filed on Jan. 28, 2005, the entire contents of each are hereby incorporated by reference.

FIELD OF THE INVENTION

The present invention relates to semiconductor memory chips, and more particularly, to an MRAM memory cell having a layer system of substantially circular-disk-shaped layers and a method for producing such an MRAM memory cell.

BACKGROUND

Magnetic Random Access Memories (MRAMs) are a promising alternative to conventional dynamic semiconductor memories. MRAMs are nonvolatile memories, which, in contrast to conventional dynamic semiconductor memories, do not need a refresh process for information retention. MRAM memory cells are substantially formed of two magnetic layers with a nonmagnetic separating layer arranged in between. MRAMs are resistant to radiation, so that information retention is ensured even when radiation is incident.

An MRAM memory cell is based on ferromagnetic storage with the aid of the tunneling magnetoresistance (TMR) effect or the giant magnetoresistance (GMR) effect. In accordance with its conventional construction, a layer stack having a soft-magnetic layer or storage layer, a tunnel oxide layer and a hard-magnetic layer or reference layer is arranged at the crossover point between bit and word lines arranged in crossed fashion. Magnetization of the reference layer is predefined, while the magnetization of the storage layer is adjustable by sending corresponding currents in different directions through the word line and the bit line. By these currents, the magnetization of the storage layer can be set parallel or antiparallel with respect to the magnetization of the reference layer. In the case of a parallel magnetization of storage layer and reference layer, the electrical resistance in the stack direction of the layer stack (i.e., from top to bottom or vice versa) is less than in the case of an antiparallel magnetization of storage layer and reference layer. This electrical resistance dependent on the different magnetization directions of the two layers can be evaluated as logic state "0" or "1".

The magnetization of the storage layer that is parallel or antiparallel with respect to the reference layer is enabled by a magnetic anisotropy of the storage layer, which defines a magnetic preferred direction. The expression "preferred direction" is conventionally used, although "preferred axis" would be more correct since both directions along the axis are equally preferred. Despite this, the expression "preferred direction" is used here.

Such a magnetic anisotropy can be provided by shape anisotropy. Thus, in the case of a magnetic layer shaped in elongate fashion in terms of its spatial form, the magnetic preferred direction corresponds to the geometrical longitudinal direction of the magnetic layer. Due to the physical conformity to law that the leakage field energy is to be as low as possible, in energetic terms, the magnetization is directed collinearly with respect to the preferred direction of the anisotropy. By applying an external magnetic field, the magnetization of the storage layer can be switched back and forth between the two energetically preferred positions, if the activation energy required to overcome the energetically unfavorable intermediate positions is made available by the external magnetic field. In practice, such a shape anisotropy of memory cells is realized, for example, by magnetic layers that are elliptically shaped in terms of their spatial form.

In the case of rotationally symmetrical magnetic layers, by contrast, the magnetic anisotropy is obtained as an intrinsic material property since an "in-plane" shape anisotropy cannot be realized. The cause of intrinsic anisotropy is under discussion, but electron diffraction data at amorphous layer materials permit the conclusion that anisotropic orientation of atomic pair axes in the direction of the magnetic field is a possible cause of the intrinsic anisotropy.

In conventional, known MRAM memory cells, magnetization of the storage layer is set parallel or antiparallel with respect to the magnetization of the reference layer since this makes it possible to obtain a maximum signal swing with regard to the change in resistance $\Delta R/R$ of the layer stack during magnetization reversal of the magnetization of the storage layer relative to the magnetization of the reference layer.

However, with a circular-disk-shaped configuration of the memory cell and in the weak intrinsic anisotropy of the storage layer, it is not possible to ensure that the magnetization of the storage layer is oriented collinearly with respect to the preferred direction. In general, a single cycle of the magnetization reversal of the storage layer establishes a remnant magnetization of the storage layer, in which case the magnetization is directed non-collinearly with respect to the preferred direction of the intrinsic anisotropy of the storage layer.

This phenomenon will now be explained in more detail with reference to FIGS. 1A-1C. FIGS. 1A-1C show a storage layer (FIGS. 1A and 1B) and a reference layer (FIG. 1C) of a conventional MRAM memory cell. To facilitate reference, FIGS. 1A-1C are provided with an X, Y axis system in which the X axis points toward the right in the horizontal direction, while the Y axis points upward in the vertical direction. The reference layer 1, a layer exhibiting hard-magnetic behavior with a circular-disc shape, is magnetized along the X axis, which is represented symbolically by the arrows 2. The storage layer 3, a layer exhibiting soft-magnetic behavior with a circular-disk shape, has a strong intrinsic anisotropy with a preferred direction along the double arrow. The preferred direction of the intrinsic anisotropy is accordingly oriented along the X axis or –X axis. In the interior of the storage layer 3, the magnetization symbolized by the arrows 4 substantially follows the course of the preferred direction of the intrinsic anisotropy. Furthermore, the magnetization 4 in the interior of the storage layer 3 is substantially oriented parallel to the magnetization 2 of the reference layer 1.

With regard to the storage layer 3 of FIG. 1A, the illustration shows a state of the storage layer after the application and switching-off an substantially homogeneous, external magnetic field 7 directed through 90° in the counterclockwise direction relative to the X axis (remnant state). Through the action of the external magnetic field 7, the magnetization 4 in the interior of the memory cell 3 is oriented parallel to the field direction thereof, but after the magnetic field 7 has been switched off, the magnetic field it reverts to a direction substantially parallel to the preferred direction of the intrinsic anisotropy. For the magnetization 5, 6 in the edge regions of the memory cell 3, by contrast, it is energetically advantageous with regard to avoiding high leakage field energies if they remain in a direction parallel to the field direction of the external magnetic field 7, even after the latter has been switched off. Although only a gradual transition of the magnetization 5, 6 of the edge regions to the magnetization 4 in the interior of the storage layer is made possible on account of the magnetic exchange interaction, the magnetization 4 in the interior of the memory cell 3, on account of the strong intrinsic anisotropy, assumes an orientation parallel to the preferred direction thereof. During magnetization reversal, the magnetization in the interior of the storage layer 3 is a collinear, i.e., parallel or antiparallel, orientation with respect to the preferred direction. As a result magnetization 4 in the interior of the storage layer 3 and the magnetization 2 of the reference layer 1 are oriented collinearly with respect to one another and a maximum signal swing with regard to the change in resistance $\Delta R/R$ of the layer stack is possible.

The behavior of a circular-disk-shaped storage layer having a weak intrinsic anisotropy differs from this, and this behavior will be explained with reference to FIGS. 2A and 2B, left-hand illustration. In order to facilitate reference, FIGS. 2A-2C are provided with an X, Y axis system in the same way as FIGS. 1A-1C.

FIGS. 2A and 2B show a storage layer 10 exhibiting soft-magnetic behavior with a circular-disk shape. The storage layer 10 has a weak intrinsic anisotropy with a preferred direction along the double arrow. As the storage layer 3 was in FIGS. 1A and 1B, the storage layer 10 is in a state after the application and switching-off of an substantially homogeneous, external magnetic field 7 directed through 90° in the counterclockwise direction relative to the X axis (remnant state). In this case, after the magnetic field 7 has been switched off, the magnetization 12, 13 in the edge regions of the storage layer 10 avoid high leakage field energies by remaining in a direction parallel to the field direction of the previously applied magnetic field. However, the magnetization in the interior of the storage layer 10 cannot attain an orientation parallel to the preferred direction due to the weak intrinsic anisotropy of storage layer. In other words, the influence of the magnetization 12, 13 in the edge regions of the storage layer 10, due to the magnetic exchange interaction, prevents a collinearity between the magnetization 111 in the interior of the storage layer 10 and the preferred direction of the intrinsic anisotropy. Consequently, a remnant magnetization 12 is established in the interior of the storage layer 10. The magnetization is oriented at an angle α in the counterclockwise direction relative to the X axis.

The explanations that the expression "strong intrinsic anisotropy" in the sense of the present invention is intended to denote those storage layers of an MRAM memory cell in which, during magnetization reversal of the storage layer, an substantially collinear orientation between the remnant magnetization in the interior of the storage layer and the preferred direction of the intrinsic anisotropy always occurs, while in contrast thereto, in the case of storage layers having a "weak intrinsic anisotropy," a remnant magnetization which is oriented non-collinearly with respect to the preferred direction occurs in the interior of the storage layer. A weak intrinsic anisotropy is typically accompanied by an anisotropy field strength of less than approximately 1 kA/m (approximately 12.6 Oe).

If the remnant magnetization of the storage layer is not directed parallel or antiparallel with respect to the magnetization direction of the reference layer, this has the very disadvantageous consequence that it is not possible to obtain the maximum signal swing with regard to the change in resistance $\Delta R/R$ of the layer stack during magnetization reversal of the magnetization of the storage layer relative to the magnetization of the reference layer. As shown by a computational consideration when a remnant magnetization occurs in the storage layer, it is possible to obtain a signal swing weighted with cos α with regard to the change in resistance $\Delta R/R$. Therefore, such storage layers cannot be used, or can be used only in a very restricted manner, for application in MRAM memory cells.

An MRAM memory cell having a circular-disk-shaped geometry of the layers of the layer stack and only weak intrinsic magnetic anisotropy of the storage layer to avoid a reduced signal swing with regard to the change in resistance $\Delta R/R$ of the layer stack during magnetization reversal of the magnetization of the storage layer relative to the magnetization of the reference layer on account of a remnant magnetization of the storage layer occurring is desirable.

SUMMARY

An MRAM memory cell has a layer system made of circular-disk-shaped layers. The layer system, in a conventional manner, includes two magnetic layers separated by a nonmagnetic intermediate layer. In this case, the first magnetic layer ("reference layer") exhibits hard-magnetic behavior and the other, second, magnetic layer ("storage layer") exhibits soft-magnetic behavior. Information is stored by the magnetization state of the storage layer. The storage layer is formed such that it has a weak intrinsic magnetic anisotropy that defines a magnetic preferred direction. The storage layer accordingly typically has an anisotropy field strength of $\leq 1$ kA/m (approximately 12.6 Oe).

Magnetization of the reference layer is oriented parallel to a remnant magnetization in the interior of the storage layer. Such a remnant magnetization occurs in storage layers having weak intrinsic magnetic anisotropy when an external magnetic field with a field component perpendicular to the preferred direction of the intrinsic anisotropy of the storage layer is applied. This is generally always the case during a conventional magnetization reversal of the MRAM memory cell, for instance, in the form of the customary "astroid switching." In an MRAM memory cell, for magnetization reversal of the MRAM storage layer, conventional electrical line tracks, for example, two word and bit lines have a current that is sent through. The magnetic field is coupled to the remnant magnetization of the storage layer. The line tracks cross one another at a right angle and the layer system includes a storage layer, a reference layer, and an intermediate layer positioned at a crossover point between the line tracks.

Due to the orientation of the magnetization of the reference layer in a direction parallel to the remnant magnetization of the storage layer, during magnetization reversal of the memory cell using an external magnetic field with a field component in a direction perpendicular to the preferred direction of the intrinsic anisotropy of the storage layer, magnetization of the storage layer and the reference layer are oriented collinearly, i.e., parallel or antiparallel, with respect to one another. This enables a maximum signal swing with regard to the change in resistance ΔR/R of the layer stack during magnetization reversal of the magnetization of the storage layer relative to the magnetization of the reference layer, so that even storage layers having a circular-disk-shaped, i.e., rotationally symmetrical, form and a weakly-formed intrinsic anisotropy can be employed for use as storage layers in MRAM memory cells.

Magnetization of the reference layer is oriented at an angle α with respect to the preferred direction of the intrinsic anisotropy of the storage layer. The angle α has a in the value range of 10° to 50°. If permalloys are used as material of the storage layer, the angle α is approximately 45°.

The storage layer of the MRAM memory cell can be constructed from a plurality of individual layers, i.e., the storage layer is formed as a multilayer system. In this case, the individual layers can be constructed from an identical material or from a different material. The individual layers are magnetically coupled and magnetic leakage field coupling and/or magnetic exchange coupling are taken into consideration. An antiferromagnetic coupling of the individual layers is generally not feasible for the storage layer since the forces that occur in this case are too large to enable an easy magnetization reversal of the storage layer in practical applications.

If the storage layer is embodied as a multilayer system, the net magnetization of the storage layer, i.e., the vectorial sum of the magnetizations of the individual layers, is zero. A mutual influencing of adjacent memory cells by the magnetizations of the magnetic layers can be avoided.

Furthermore, the reference layer in combination with the storage layer, if appropriate can be constructed from a plurality of individual layers. In this case, the individual layers are magnetically coupled by antiferromagnetic coupling and/or magnetic exchange coupling and/or magnetic leakage field coupling. With regard to the mutual influencing of adjacent memory cells, it is desirable of the net magnetization of the reference layer is zero.

According to the invention, the materials of the storage layer and/or of the reference layer can be based on an alloy of the (Co, Ni, Fe) system. The (Co, Ni, Fe) system includes alloys which have one component of the system or an arbitrary combination of a plurality of components of the system, for instance, an Ni—Fe alloy or an Ni—Fe—Co alloy. In addition, the (Co, Ni, Fe) system can have further components, such as Si and B, for example, by which an amorphous structure can be imparted to the alloys. According to the invention, the materials of the storage layer and/or reference layer are amorphous alloys. Such an amorphous alloy based on the (Co, Ni, Fe) system is a Co—Fe—B alloy or a Co—Fe—Si alloy, for example.

According to the invention, the material of the intermediate layer arranged between the storage layer and the reference layer can be AlO. If the storage layer and/or reference layer are/is formed as a multilayer system, the individual layers can be separated from one another by intermediate layers comprised of Ta or Ru, for example.

A method for producing an MRAM memory cell according to the invention includes providing a layer system of circular-disk-shaped layers, generating a first, substantially homogeneous, external magnetic field during a first elevated-temperature age hardening of the layer system, and age hardening the layer system at a first elevated temperature at a temperature below the Curie point of storage layer and reference layer. The layer system includes two magnetic layers separated by a nonmagnetic intermediate layer. The first magnetic layer of reference layer exhibits hard-magnetic behavior. The second magnetic layer or storage layer exhibits soft-magnetic behavior. Information is stored by the magnetization state of the second magnetic layer. In addition, the storage layer has a weak intrinsic magnetic anisotropy defining a magnetic preferred direction. The direction of the first magnetic field is chosen to be oriented at an angle α with respect to the preferred direction of the intrinsic anisotropy of the storage layer, i.e., the direction of the first magnetic field is substantially parallel to the magnetization of a remnant magnetization in the interior of the storage layer. The remnant magnetization of the storage layer occurs as a result of the application of an external magnetic field with a field component perpendicular to the preferred direction of the intrinsic anisotropy of the storage layers, which is generally the case during magnetization reversal of the MRAM memory cells. The field strength of the first magnetic field is greater than the saturation field strength of the reference layer, so that the magnetization of the reference layer is oriented along the field direction of the first magnetic field.

Consequently, magnetization of the reference layer is achieved during the first elevated-temperature age hardening of the layer system. The magnetization of the reference layer is directed parallel to the reference magnetization of the storage layer.

The first magnetic field is oriented such that the angle α has a value in the value range of 10° to 50°.

Depending on the field strength of the applied first magnetic field and the material properties of the storage layer, the preferred direction of the weak intrinsic anisotropy of the storage layer is oriented in the field direction of the first magnetic field. This is undesirable, however, since a remnant magnetization occurring during magnetization reversal in the storage layer ensures that the magnetization directions of the reference layer and of the storage layer are no longer collinear. In this case, the method further includes generating a second, substantially homogeneous, external magnetic field during a second elevated-temperature age hardening of the layer system, and age hardening the layer system at a temperature below the Curie point of the two magnetic layer systems. The direction of the second magnetic field is at an angle −α, i.e., an angle diametrically opposite to the angle α with respect to the direction of the first magnetic field. The field strength of the second magnetic field is less than the saturation field strength of the reference layer, so that the magnetization of the reference layer remains substantially unchanged during the second elevated-temperature age hardening. The preferred direction of the weak intrinsic anisotropy of the storage layer is oriented along the field direction of the second magnetic field.

The preferred direction of the intrinsic anisotropy of the storage layer is directed in its original direction before the first elevated-temperature age hardening, so that the remnant magnetization of the storage layer and the magnetization of the reference layer are substantially collinear.

The distinction made here between a "first" elevated-temperature age hardening and a "second" elevated-temperature age hardening, including the associated distinctions for the temperatures and the magnetic fields, is for reasons of clarity. This should not be understood, however, to mean that a first elevated-temperature age hardening and a second elevated-temperature age hardening are always provided in the method according to the invention. Rather, the second elevated-temperature age hardening may be omitted under the circumstances mentioned above.

In the method according to the invention if the temperature during the first and second elevated-temperature age hardening lies in a range of 250° C. to 350° C. The field strength of the first magnetic field has value in the range of 0.1 to 2 tesla, while the field strength of the second magnetic field has a value in the range of 0.001 to 0.1 tesla.

According to the invention, the storage layer can be formed in intrinsic anisotropic fashion by heat treatment in an external magnetic field. However, this may equally be effected by oblique ion beam sputtering or ion beam sputtering in an external magnetic field, in which case each method can be applied by itself or in combination with other methods.

BRIEF DESCRIPTION OF THE DRAWINGS

The invention will now be explained in more detail on the basis of exemplary embodiments, reference being made to the accompanying drawings, in which:

FIGS. 1A, 1B, and 1C show a schematic illustration of a storage layer (FIGS. 1A and 1B) and a reference layer (FIG. 1C) of an MRAM memory cell from the prior art;

FIGS. 3A and 3B show a schematic illustration of an upper individual layer and a lower individual layer, respectively, of a storage layer for use in a second embodiment of an MRAM memory cell according to the invention.

DETAILED DESCRIPTION

Figure 2A:
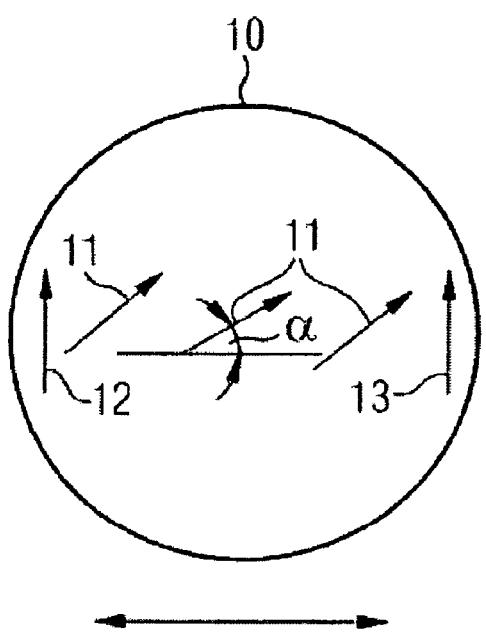
FIGS. 2A, 2B, and 2C show a schematic illustration of the storage layer (FIGS. 2A, and 2B) and the reference layer (FIG. 2C) for use in a first embodiment of an MRAM memory cell according to the invention.
Figure 2C:
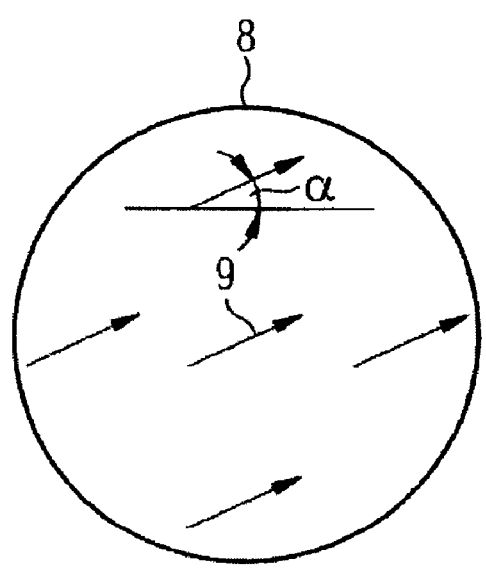
Figure 2C:
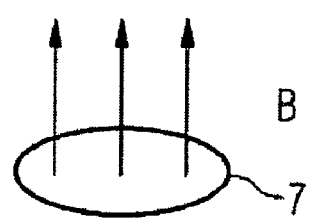
Figure 2B:
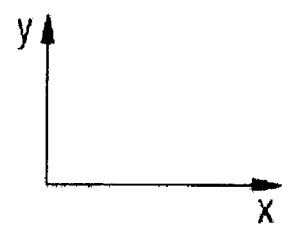

Referring to FIGS. 2A-2C, which shows a schematic illustration of the storage layer 10 and the reference layer 8 for use in a first embodiment of an MRAM memory cell according to the invention, the storage layer 10 is formed in a circular-disk shape and has a weak intrinsic anisotropy that defines a preferred direction along the double arrow. The reference layer 8 exhibiting hard-magnetic behavior is likewise formed in a circular-disk shape.

FIGS. 2A and 2B show a state of the storage layer 10 after the application and switching-off of a substantially homogeneous, external magnetic field 7 directed through 90° in the counterclockwise direction relative to the X axis (remanence). Due to the only weak intrinsic anisotropy and the resultant influence of the magnetization 12, 13 of the edge regions of the storage layer 10 on the magnetization 11 in the interior of the storage layer 10, a remnant magnetization 11 occurs which is oriented at an angle α in the counterclockwise direction with respect to the X axis.

In accordance with the invention, the magnetization 9 of the reference layer 8 is oriented through the same angle α in the counterclockwise direction with respect to the X axis, so that the remnant magnetization 11 in the interior of the storage layer 10 is oriented substantially parallel to the magnetization 9 of the reference layer 8.

A first embodiment of an MRAM memory cell according to the invention includes the reference layer 8 and storage layer 10 shown in FIGS. 2A-2C.

FIGS. 3A and 3B show a schematic illustration of an upper individual layer 14 and a lower individual layer 15 of a circular-disk-shaped storage layer. The two individual layers 14, 15 shown in FIGS. 3A and 3B thus form the storage layer of an MRAM cell in the form of a two-layer system. A second embodiment of the MRAM memory cell according to the invention comprises, as storage layer, the two-layer system shown in FIGS. 3A and 3B and a reference layer shown in FIG. 2C, right-hand illustration.

In order to facilitate reference, an X, Y axis system corresponding to the X, Y axis systems of FIGS. 1C and 2C are depicted in FIG. 3.

FIGS. 3A and 3B show a state of the individual layers 14, 15 after the application and switching-off of a substantially homogeneous, external magnetic field directed through 90° in the counterclockwise direction relative to the X axis (remanence). Due to a weak intrinsic anisotropy and the resultant effect of the magnetization of the edge regions on the magnetization in the interior of the storage layers of the individual layers, a respective remnant magnetization 16, 19 remains which is oriented at a angle α and 180°+α, respectively, in the counterclockwise direction with respect to the X axis.

The two individual layers 14, 15 of the storage layer are coupled to one another by magnetic leakage field coupling. As a consequence, the magnetization 17, 18 in the edge region of the upper individual layer 5 is established antiparallel with respect to the magnetization 20, 21 in the edge region of the lower individual layer 15. Likewise, the magnetization 16 in the interior of the individual layer 14 is established antiparallel with respect to the magnetization 19 in the interior of the individual layer 15.

The individual layers 14, 15 of the storage layer as shown in FIGS. 3A and 3B may be part of the following layer stack for production of an MRAM memory cell according to the invention.

Firstly, a two-layered reference layer made of a Co—Fe—Ni alloy with an intervening layer made of Ru is applied on a conventional substrate. In this case, the two layers made of a ferromagnetic alloy have a layer thickness of 2 nm, while the intervening layer made of Ru has a layer thickness of 1 nm. The magnetization of the reference layer is oriented at an angle α=45° in the counterclockwise direction with respect to a preferred direction of the intrinsic anisotropy of the storage layer, said preferred direction corresponding to the X axis of FIG. 3. The individual layers of the reference layer made of a Co—Fe—Ni alloy are coupled to one another by magnetic exchange coupling. An intermediate layer made of AlO having a layer thickness of 3 nm is formed on the reference layer. Situated above the intermediate layer is a double-layered storage layer made of an Ni—Fe alloy separated by an intermediate layer made of Ta. In this case, the two individual layers of the storage layer made of an Ni—Fe alloy correspond to the embodiment shown in FIGS. 3A and 3B. The layer thicknesses of the layers of the storage layer are in each case 3 nm, while the layer thickness of the Ta layer is 1 nm. The magnetizations of the Ni—Fe alloys are coupled to one another by magnetic leakage field coupling. The layer stack substantially has a circular-disk shape having a disk diameter of 300 nm.

In order to form a weak intrinsic anisotropy in the storage layer, the layer stack was firstly subjected to heat treatment in an external magnetic field having a field strength of 100 mT. The heat treatment was effected at a temperature of 250° C. Afterward, for magnetizing the reference layer, the layer stack is subject to elevated-temperature age hardening at a temperature of 300° C., with application of a first, substantially homogeneous, external magnetic field having a field strength of 1 tesla. In this case, the field direction of the first external magnetic field is chosen to correspond to the direction of a remnant magnetization of the storage layer, i.e., the field direction of the first magnetic field assumed an angle α=45° in the counterclockwise direction with respect to the X axis. Since, in this case, the preferred direction of the intrinsic anisotropy also rotated in the field direction of the first magnetic field, a second elevated-temperature age hardening was carried out at a temperature of 250° C., but a field strength of merely 0.1 tesla was used. In this case, the field direction of the second magnetic field was chosen in such a way that it assumes an angle −α with respect to the field direction of the first magnetic field, with the result that, in this case, only the preferred direction of the intrinsic anisotropy is oriented in its original direction before the application of the first magnetic field.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

REFERENCE SYMBOLS

1 Reference layer
2 Inner region magnetization
3 Storage layer
4 Inner region magnetization
5 Edge region magnetization
6 Edge region magnetization
7 External magnetic field
8 Reference layer according to the invention
9 Inner region magnetization
10 Storage layer
11 Inner region magnetization
12 Edge region magnetization
13 Edge region magnetization
14 Storage layer (upper layer)
15 Storage layer (lower layer)
16 Inner region magnetization
17 Edge region magnetization
18 Edge region magnetization
19 Inner region magnetization
20 Edge region magnetization
21 Edge region magnetization

What is claimed is:

1. An MRAM memory cell having a layer system of substantially circular-disk-shaped layers, comprising:
   two magnetic layers separated by a non-magnetic intermediate layer, the first magnetic layer exhibiting hard-magnetic behavior, the second magnetic layer exhibiting soft-magnetic behavior such that information is stored by a magnetization state of the storage layer, the storage layer having a weak intrinsic anisotropy defining a magnetic preferred direction,
   wherein magnetization of the reference layer is substantially parallel to a remnant magnetization in the interior of the storage layer, the remnant magnetization occurring as a result of applying an external magnetic field with a field component perpendicular to the preferred direction of the intrinsic anisotropy of the storage layer.

2. The MRAM memory cell as claimed in claim 1, wherein the magnetization of the reference layer is directed at an angle α with respect to the preferred direction of the intrinsic anisotropy of the storage layer, the angle α having a value in the range of 10° to 50°.

3. The MRAM memory cell as claimed in claim 1, wherein the materials of the reference layer and/or storage layer are based on an alloy comprising at least one of Co, Ni and Fe.

4. The MRAM memory cell as claimed in claim 3, wherein the materials of the storage layer and/or reference layer are amorphous alloys.

5. The MRAM memory cell as claimed in claim 1, wherein the storage layer has a weak intrinsic anisotropy field strength of less than 1kA/m.

* * * * *